United States Patent

Collard

[15] 3,678,995

[45] July 25, 1972

[54] SUPPORT FOR ELECTRICAL COMPONENTS AND METHOD OF MAKING THE SAME

[72] Inventor: Jacques Roger Collard, Trenton, N.J.

[73] Assignee: RCA Corporation, New York, N.Y.

[22] Filed: June 22, 1970

[21] Appl. No.: 47,981

[52] U.S. Cl. ........................165/185, 174/DIG. 5, 29/470.5, 29/472.9, 29/589, 317/234 A

[51] Int. Cl. ........................................................H01l 1/12

[58] Field of Search ........................317/234 A; 165/80, 185; 174/DIG. 5, 15; 29/470.5, 472.9, 589

[56] References Cited

UNITED STATES PATENTS 2,817,048 12/1957 Thuermel et al...................317/234 A

OTHER PUBLICATIONS

Dyment, J. C., et al. Diamond Heat Sinks Applied Physics Letters, Vol. 11, No. 9, Nov. 1, 1967 pgs. 292-4

Josenhans, J. G. Diamond As An Insulating Heat Sink Procdgs. of the IEEE, Apr. 1968 pgs. 762-3

*Primary Examiner*—Albert W. Davis, Jr.
*Attorney*—Glenn H. Bruestle

[57] ABSTRACT

A heat conducting support on which an electrical component can be mounted so as to conduct heat generated by the component away from the component. The support includes a substrate of good heat conducting material and a diamond body embedded in the substrate with a surface of the diamond body being flush with a surface of the substrate. A metal film extends over the surface of the substrate and the diamond body and is strongly adhered to the substrate. An electrical component can be mounted on and secured to the metal film over the diamond body. The support is formed by placing the diamond body on the surface of a plate of the material of the substrate and coating the surface of the plate around the diamond body with additional material of the substrate. The coating contacts the peripheral edge of the diamond body to secure the diamond body to the substrate and extends to the surface of the diamond body. A metal film can then be deposited on the surface of the diamond body and the coating.

4 Claims, 4 Drawing Figures

INVENTOR
Jacques R. Collard
BY
ATTORNEY

SUPPORT FOR ELECTRICAL COMPONENTS AND METHOD OF MAKING THE SAME

BACKGROUND OF THE INVENTION

The present invention relates to a support for electrical components and a method of making the same. More particularly, the present invention relates to a support having good heat conducting properties so as to conduct heat away from the electrical component mounted on the support.

Almost all electrical components, such as resistors, capacitors and semiconductor devices, generate heat when used in an electrical circuit. To achieve the most efficient operation of such components it is desirable to provide such components with means for dissipating the generated heat from the components. This is particularly so for electrical components which are operated at high power levels. One technique used for dissipating the heat is to mount the component on a support of a good heat conducting material. It is known that diamond is one of the best heat sink materials because of its excellent heat dissipating properties. However, there has been found to be a number of problems in attempting to use diamond as a heat dissipating support for electrical components. Pieces of diamond of uniform size and shape are relatively expensive so that their use greatly increases the cost of a component assembly using them. Although pieces of diamond of non-uniform geometry are considerably less expensive, they are difficult to use, particularly in the automatic assembly of the electrical components. Also, it is necessary to coat the surfaces of the diamond pieces with thin metal layers to permit the components to be secured to the diamond pieces and to secure the diamond pieces to a housing or similar support. It has been found that the metal film has poor adhesion to the diamond pieces so that is is difficult to achieve a good mechanical bond between the pieces and the components or the housing.

SUMMARY OF THE INVENTION

A heat conducting support for an electrical component includes a substrate of a good heat conducting material having a surface. A diamond body is embedded in the substrate and has a surface which is substantially flush with a surface of the substrate. The support may be formed by placing a diamond body on the surface of a plate of a good heat conducting material and coating the surface of the plate around the diamond body with a layer of a good heat conducting material with the layer being adhered to the plate and contacting peripheral edge of the diamond body so as to secure the body to the plate.

DETAILED DESCRIPTION

Figure 1:
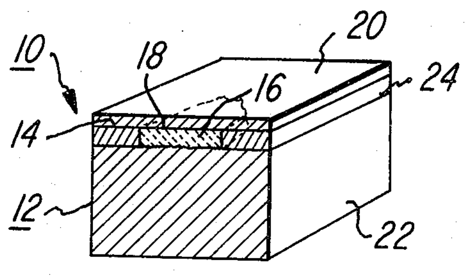
FIG. 1 is a sectioned perspective view of a form of the support of the present invention.

Referring initially to FIG. 1, a form of the support of the present invention is generally designated as 10. The support 10 comprises a substrate 12 of regular geometry having a planar upper surface 14. Although the substrate 12 is shown as being rectangular, it can be cylindrical or any other desired shape. A diamond body 16 is embedded in the substrate 12 at the upper surface 14 and has an upper surface 18 which is flush with the upper surface 14 of the substrate 12. The diamond body 16 can be of irregular geometry and has a surface area smaller than the surface area of the substrate 12 so that the periphery of the diamond body is spaced from the periphery of the substrate. A thin metal layer 20 is coated on the upper surfaces 14 and 18 of the substrate 12 and the diamond body 16 and is strongly adhered to the upper surface 14 of the substrate.

The substrate 12 comprises a base 22 and a metal layer 24 on and adhered to the base 22. The metal layer 24 completely surrounds and contacts the periphery of the diamond body 16 so as to secure the diamond body to the substrate. The metal layer 24 preferably is of a thickness substantially equal to the thickness of the diamond body 16 and provides the upper surface 14 of the substrate 12. The base 22 is of a good heat conducting material which may be a metal, such as copper, silver, molybdenum etc., or a ceramic, such as alumina or beryllia. The metal layer 24 is of a metal which is a good conductor of heat, such as copper, silver, gold, molybdenum etc. Also, the metal used for the metal layer 24 should be one which will have good adhesion to the particular material used for the base 22. The thin metal layer 20 may be of any metal which will have good adhesion to the metal of the metal layer 24 and to which an electrical component can be easily secured and which has a low electrical resistance. The thin metal layer 20 can be either a single film of a suitable metal or multiple layers of different metals with the lowest film being of a metal which adheres well to the metal layer 24 and the top most film being of a high conductivity metal to which the electrical component can be secured. Suitable metals for the thin metal layer 20 are aluminum, chromium, nickel, gold and silver or combinations of these metals.

In the use of the support 10, an electrical component is mounted on and secured to the thin metal film 20 directly over the diamond body 16. Although the thin metal film 20 may not adhere well to the diamond body 16, it is strongly adhered to the surface 14 of the substrate. Thus, by bonding the electrical component to the thin metal film 20, the component will be strongly adhered to the substrate 12. Since the electrical component is mounted directly over the diamond body 16 any heat generated in the electrical component is conducted to the top surface 18 of the diamond body 16. Diamond has the property of spreading heat received therein over the entire volume of the diamond body. Therefore, the heat received at the top surface 18 of the diamond body 16 spreads out through the diamond body and is dissipated from the body from both the bottom surface and the peripheral edge surface of the diamond body. Thus, the diamond body 16 dissipates the heat over a surface area larger than the surface area which receives the heat from the electrical component. Although the material of the substrate 12 may be a poorer conductor of heat than the diamond body 16, since the substrate receives the heat from the diamond body over a larger surface area, the substrate will dissipate more heat from the electrical component that if the electrical component was seated directly on the material of the substrate. Thus, the support 10 will conduct more heat away from the electrical component so that the component will operate at a lower temperature and thereby increase the efficiency and reliability of the component.

Figure 2:
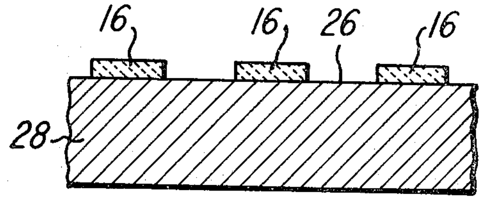
FIGS. 2–4 are sectional views illustrating the steps of making the support of the present invention.
Figure 3:
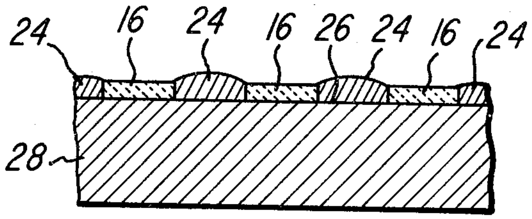
Figure 4:
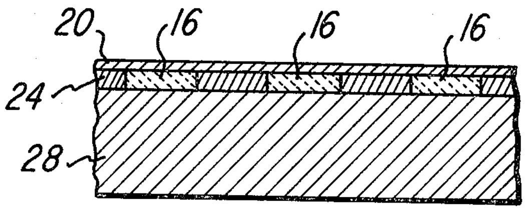

Referring to FIGS. 2–4 there is illustrated the steps of making the support 10. As shown in FIG. 2, a plurality of diamond bodies 16 are placed in spaced relation on a surface 26 of a base plate 28 of the material of the base 22 of the substrate 12. The diamond bodies 16 may be of irregular shape and of non-uniform size. The diamond bodies 16 may be temporarily held to the surface 26 of the base plate 28 by a small dab of a cement. As shown in FIG. 3, the metal layer 24 is then coated on the entire area of the base plate surface 26 around and between the diamond bodies 16 so as to contact the periphery of each of the diamond bodies. The metal layer 24 is deposited on the base plate 28 to a thickness at least as thick as the diamond bodies 16. Although the metal layer 24 can be formed by any well known technique for depositing the particular metal used, electroforming is preferred since it permits the deposition of a thick layer in a reasonable period of time. When a metal layer 24 is deposited on a ceramic base plate 28 by electroforming, the base plate surface 26 should be coated with a thin film of the metal, such as by evaporation in a vacuum or electroless plating, prior to mounting the diamond bodies 16 on the base plate. The thin metal film will then serve as an electrode for electroforming the metal layer 24 on the base plate.

The surface of the metal layer 24 is then polished until it is flush with the upper surfaces of the diamond bodies 16. As shown in FIG. 4, the thin metal layer 20 is then coated on the metal layer 24 and the diamond bodies 16. The thin metal layer 20 can be formed by any well known technique for depositing the metal or metals of the thin metal layer 20, such as by evaporation in a vacuum or electroless plating. The individual supports 10 are then separated from each other by cutting through the base plate 28, metal layer 24 and thin metal layer 20 within the spaces between the diamond bodies 16. The cutting can be accomplished with any means suitable for the particular materials of the support, such as by sawing or with a metal cutter. The cuts are made so that each of the supports 10 is of uniform size and shape. Thus, this method permits the use of diamond bodies of irregular shape and non-uniform size but provides supports which are of uniform size and shape.

EXAMPLE

Supports can be made by placing a plurality of diamond bodies in spaced relation on the top surface of a copper base plate. The diamond bodies are of regular shape but are approximately 0.040 inches in diameter and 0.020 inches thick. The base plate is 0.040 inches in thickness. Each of the diamond bodies is temporarily secured to the base plate by a dab of a plastic cement. A layer of a masking material is applied to the bottom surface of the base plate. After cleansing the exposed area of the top surface of the base plate, a layer of copper is electroplated on the top surface around the diamond bodies. The electroplating is carried out in an aqueous solution of copper fluorborate (60 oz. of copper fluorborate per gallon of water for a ph of approximately 0.5) at room temperature, at a current density of 100 amps per square foot and under rapid mechanical agitation of the plating solution. After 3 hours of plating, the device is removed from the plating solution, rinsed in cold water and air dried. The masking layer is then removed with acetone. The copper layer is then lapped with 600 grit silicon carbide until the surfaces of the diamond bodies and the copper layer are flush. The back side of the base plate is similarly lapped until the total thickness of the base plate and copper layer is approximately 0.040 inch. A thin film of chromium, approximately 100A in thickness, is coated over the flush surfaces of the copper layer and the diamond bodies by evaporation in a vacuum, and a thin film of gold, approximately 3 microns in thickness, is similarly coated over the chromium film. The supports are separated by cutting with a saw through the base plate and metal layers between the diamond bodies. The finished supports have cross-sectional dimensions of about 0.070 by 0.065 inches.

It should be understood that the above example is merely illustrative of one specific form of the support and that supports of the present invention can be similarly made of any desired shape using other materials for the substrate. Thus there is provided a support for an electrical component which includes a diamond body to achieve improved heat conduction from the electrical component. Also, the support can use the relatively inexpensive irregularly shaped diamond bodies yet provides a support of uniform shape and size which can be easily handled for automatic assembly with the electrical component.

I claim:

1. A heat conducting support for an electrical component comprising:

a. a substrate of good heat conducting material, b. a diamond body embedded in said substrate so that the substrate extends completely around and contacts the periphery of the diamond body and having a surface substantially flush with a surface of said substrate, and c. a metal film extending over the surface of the substrate and the diamond body and strongly adhered to the substrate surface.

2. A support in accordance with claim 1 in which the substrate comprises a base and a metal layer on the base, said metal layer surrounding the periphery of the diamond body and providing the surface which is flush with the surface of the diamond body.

3. A support in accordance with claim 2 in which the base is of a metal.

4. A support in accordance with claim 2 in which the base is of a ceramic.

* * * * *